United States Patent
Park

(10) Patent No.: US 7,848,147 B2
(45) Date of Patent: Dec. 7, 2010

(54) NONVOLATILE SEMICONDUCTOR MEMORY DEVICE AND WRITING METHOD OF THE SAME

(75) Inventor: Jun Young Park, Yongin-Si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 300 days.

(21) Appl. No.: 12/062,352

(22) Filed: Apr. 3, 2008

(65) Prior Publication Data

US 2008/0279009 A1 Nov. 13, 2008

(30) Foreign Application Priority Data

May 11, 2007 (KR) ...................... 10-2007-0046011

(51) Int. Cl.
*G11C 16/04* (2006.01)
(52) U.S. Cl. .............................. 365/185.18; 365/185.12; 365/185.13; 365/185.17; 365/185.23; 365/189.03; 365/189.14; 365/189.16; 365/189.17; 365/189.05; 365/230.06
(58) Field of Classification Search ............ 365/185.12, 365/185.13, 185.17, 185.18, 185.23, 185.33, 365/189.03, 189.14, 189.16, 189.17, 189.05, 365/230.06, 230.08, 233.19, 239, 240
See application file for complete search history.

(56) References Cited

U.S. PATENT DOCUMENTS 5,606,532 A 2/1997 Lambrache et al.
7,505,341 B2* 3/2009 Kim et al. .................... 365/205
7,515,485 B2* 4/2009 Lee ......................... 365/189.05
2002/0126531 A1* 9/2002 Hosono et al. ......... 365/185.17
2007/0253242 A1* 11/2007 Parkinson et al. ........... 365/163

FOREIGN PATENT DOCUMENTS

KR 93-20472 10/1993
KR 1020000015949 3/2000

OTHER PUBLICATIONS

English Abstract Publication No. 1019950003013 (for 93-20472), Mar. 1995.
English Abstract Publication No. 1020000015949, Mar. 2000.

* cited by examiner

*Primary Examiner*—Huan Hoang
*Assistant Examiner*—Fernando N Hidalgo
(74) *Attorney, Agent, or Firm*—F. Chau & Associates, LLC

(57) ABSTRACT

A nonvolatile semiconductor memory device and a writing method thereof are provided. The nonvolatile semiconductor memory device includes a cell array, a controller configured to receive input data from an outside source, an address latch unit configured to store a Y-address of the input data and X-addresses respectively corresponding to at least two wordlines, over which the input data is written, based on an address of the input data output from the controller, and a page buffer configured to receive the input data from the controller and temporarily store the input data. The controller writes the data stored in the page buffer over the two wordlines in the cell array based on the at least two X-addresses and the Y-address.

16 Claims, 6 Drawing Sheets

NONVOLATILE SEMICONDUCTOR MEMORY DEVICE AND WRITING METHOD OF THE SAME

CROSS-REFERENCE TO RELATED PATENT APPLICATION

This application claims priority to Korean Patent Application No. 10-2007-0046011, filed on May 11, 2007, in the Korean Intellectual Property Office, the disclosure of which is incorporated herein in its entirety by reference.

BACKGROUND OF THE INVENTION

1. Technical Field

The present invention relates to a semiconductor memory device, and more particularly, to a nonvolatile semiconductor memory device and writing method for the nonvolatile semiconductor memory device.

2. Discussion of the Related Art

Semiconductor memory devices may be either volatile semiconductor memory devices or nonvolatile semiconductor memory devices. Volatile semiconductor memory devices include dynamic random access memory (DRAM) and static random access memory (SRAM). Volatile semiconductor memory devices are capable of fast reading and writing but stored information disappears when external power supply is interrupted. Nonvolatile semiconductor memory devices include mask read-only memory (MROM), programmable read-only memory (PROM), erasable programmable read-only memory (EPROM), and electrically erasable programmable read-only memory (EEPROM). Nonvolatile semiconductor memory devices retain information even when external power supply is interrupted. Accordingly, nonvolatile semiconductor memory devices are used to store information that should be retained regardless of the supply of power.

With respect to MROM, PROM, and EPROM, it is not easy for normal users to change stored information since erase and write operations cannot be freely performed. On the other hand, EEPROM enables electrical erase and write operations and is thus increasingly used where memory is continuously update or where memory is part of an auxiliary memory device. Particularly, flash EEPROM (hereinafter, referred to as a flash memory device) has a higher degree of integration than other existing forms of EEPROM and is thus often used as a large-capacity auxiliary memory device. When data is written to or read from a memory cell array in such EEPROM, a page buffer may be used in order to perform a write or read operation in units of pages.

FIG. 1 is a schematic functional block diagram of a conventional nonvolatile semiconductor memory device 10. Referring to FIG. 1, a controller 1 included in the nonvolatile semiconductor memory device 10 (e.g., EEPROM) receives externally input data DATA and an address ADDR indicating a position where the input data DATA will be written to in a cell array 5. The input data DATA may be temporarily stored in a page buffer 6 via a Y-decoder 7. The address ADDR may be temporarily stored in an address latch unit 2.

The address latch unit 2 may include an X-address latch 8 and a Y-address latch 9. The address ADDR may be divided into an X-address and a Y-address, which may be stored in the X-address latch 8 and the Y-address latch 9, respectively. In addition, the stored X-address and the stored Y-address may be respectively converted by a pre-decoder 3 into a row selection signal and a column selection signal for selecting a cell in the cell array 5. The row selection signal and the column selection signal may be output to an X-decoder 4 and the Y-decoder 7, respectively. The X-decoder 4 receives the row selection signal output from the pre-decoder 3 and selects a wordline corresponding to the row selection signal. The Y-decoder 7 receives the column selection signal and loads data DATA corresponding to the column selection signal to the page buffer 6.

The controller 1 may perform a write operation by controlling the page buffer 6 and a high-voltage generator (not shown) to perform an erase operation and a program operation on a memory cell corresponding to a wordline selected by the X-decoder 4 and a bitline selected by the Y-decoder. Accordingly the data DATA loaded to the page buffer 6 is written to the cell array 5.

However, according to this conventional writing method, the data DATA cannot be written to an exact address desired by a user when the data is sufficiently large to be written over two wordlines. For example, where there are 8 memory cells on a single wordline, the page buffer 6 has a size of 8, a user may want to write data D1, D2, D3, D4, D5, D6, D7, and D8 starting from a fifth memory cell on a first wordline. The data D1, D2, D3, and D4 should be stored in fifth, sixth, seventh, and eighth memory cells on the first wordline, and therefore, the data D1, D2, D3, and D4 are stored in fifth, sixth, seventh, and eighth latches of the page buffer 6. Since the data starting from D5 should be written to a second wordline, the X-decoder 4 selects the second wordline and the data D5, D6, D7, and D8 are stored in first, second, third, and fourth latches of the page buffer 6. Accordingly, the data loaded to the page buffer 6 is arranged in the following order: D5, D6, D7, D8, D1, D2, D3, and D4 and the X-decoder 4 selects the second wordline. As a result, the data is written to the second wordline in the following order: D5, D6, D7, D8, D1, D2, D3, and D4.

Accordingly, when writing data of a size equal to the page buffer, the user should always set a start address to the first address of a predetermined wordline. Otherwise all data loaded to the page buffer 6 are written to a last wordline as described above, and eventually, the data is written to unexpected places. As a result, the user may have to set the start address so that writing is performed starting from the first cell on a wordline.

SUMMARY OF THE INVENTION

Some exemplary embodiments of the present invention provide a nonvolatile semiconductor memory device and method for using the device and a user does not need to set a start address in a cell array when data is to be written using a page buffer.

According to some exemplary embodiments of the present invention, a nonvolatile semiconductor memory device includes a cell array. A controller is configured to receive input data from an outside source. An address latch unit is configured to store a Y-address of the input data and at least two X-addresses of the input data respectively, corresponding to at least two wordlines, over which the input data is written. The input data is written based on an address of the input data output from the controller. A page buffer is configured to receive the input data from the controller and temporarily store the input data. The controller may write the data stored in the page buffer over the two wordlines in the cell array based on the at least two X-addresses and the Y-address.

The address latch unit may include a first X-address latch configured to store a start X-address corresponding to a first wordline to which the input data is written in the cell array. At least one next X-address latch is configured to store a next X-address corresponding to a wordline next to the first wordline when the input data is written to the next wordline. A Y-address latch is configured to store the Y-address of the input data.

When it is determined, based on the address of the input data output from the controller, that the input data is written to the next wordline, the nonvolatile semiconductor memory device may further include a latch controller configured to control the address latch unit to store the next X-address in the at least one next X-address latch.

The page buffer may include a first latch unit configured to store data up to the size of the page buffer. A second latch unit is configured to store at least part of the data stored in the first latch unit. A switch is configured to selectively transmit at least part of the data stored in the first latch unit to the second latch unit. The controller may write data stored in the second latch unit to the cell array.

The nonvolatile semiconductor memory device may further include a page buffer controller configured to control the switch.

The address latch unit may further include a page buffer clear latch configured to erase data written to the cell array from the first latch unit and the second latch unit. Here, the page buffer controller may receive information stored in the page buffer clear latch and clear the first latch unit and the second latch unit of data corresponding to the received information.

The nonvolatile semiconductor memory device may further include a selector configured to selectively output an X-address stored in either the first X-address latch or the at least one next X-address latch. Here, the controller may operate to select at least one cell in the cell array based on the X-address output from the selector and the Y-address output from the Y-address latch.

The cell array may be flash memory or an electrically erasable and programmable read only memory (EEPROM).

According to exemplary embodiments of the present invention, a nonvolatile semiconductor memory device includes a cell array, a controller configured to receive data input from an outside source, an address latch unit configured to store an address of the data output from the controller, and a page buffer including at least two latch units. The controller may write data stored in one of the at least two latch units to the cell array.

The page buffer may include a first latch unit configured to store data up to a size of the page buffer, a second latch unit configured to store at least part of the data stored in the first latch unit, and a switch configured to selectively transmit at least part of the data stored in the first latch unit to the second latch unit. The controller may control the switch to transmit at least part of the data stored in the first latch unit to the second latch unit and write the at least part of the data in the second latch unit to the cell array.

According to exemplary embodiments of the present invention, a writing method of a nonvolatile semiconductor memory device includes loading input data to a first latch unit. Data corresponding to a first wordline among the input data is loaded to a second latch unit. The data loaded to the second latch unit is written to a cell array. Data corresponding to a second wordline is transmitted to the second latch unit. The data corresponding to the second wordline in the second latch unit is transmitted to the cell array.

The loading of the input data to the first latch unit and the loading of data corresponding to the first wordline among the input data to the second latch unit may include detecting an address corresponding to the second wordline based on an address of the input data. When the address corresponding to the second wordline is detected, the address corresponding to the second wordline is stored in at least one next X-address latch. The input data is transmitted from the first latch unit to the second latch unit until the address corresponding to the second wordline is detected.

The writing method may further include clearing the first latch unit and the second latch unit of the data corresponding to the first wordline before the transmitting the data corresponding to the second wordline to the second latch unit.

The writing of the data corresponding to the second wordline in the second latch unit to the cell array may include writing the data to the cell array based on the address, which corresponds to the second wordline and is stored in the at least one next X-address latch.

BRIEF DESCRIPTION OF THE DRAWINGS

The above and other features and aspects of exemplary embodiments of the present invention will become more apparent by describing in detail exemplary embodiments thereof with reference to the attached drawings in which.

DETAILED DESCRIPTION OF THE EXEMPLARY EMBODIMENTS

Figure 1:
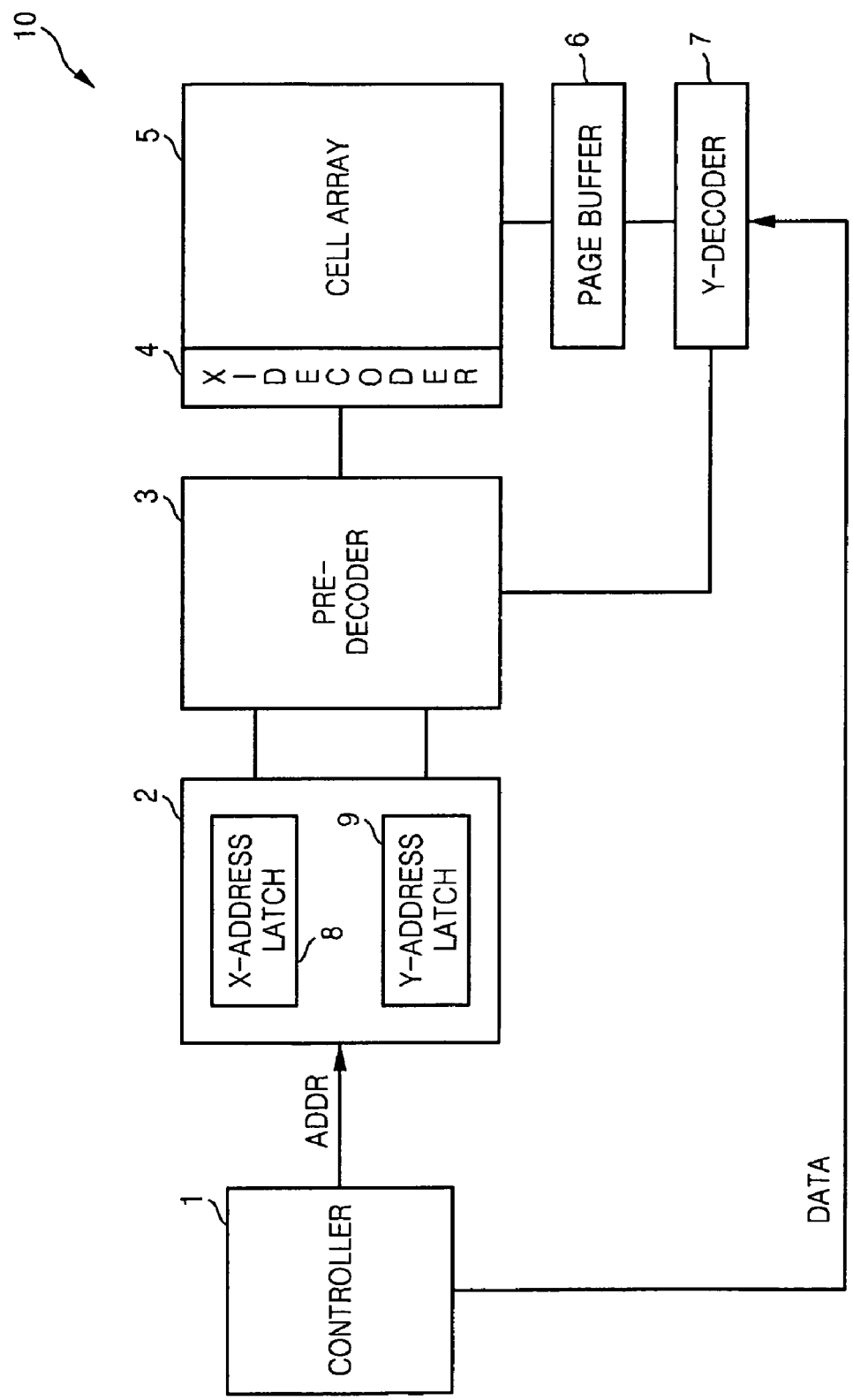
FIG. 1 is a schematic functional block diagram of a conventional nonvolatile semiconductor memory device.

Exemplary embodiments of the present invention are described more fully hereinafter with reference to the accompanying drawings, in which exemplary embodiments of the invention are shown. This invention may, however, be embodied in many different forms and should not be construed as limited to the exemplary embodiments set forth herein. In the drawings, the size and relative sizes of layers and regions may be exaggerated for clarity. Like numbers may refer to like elements throughout.

It will be understood that when an element is referred to as being "connected" or "coupled" to another element, it can be directly connected or coupled to the other element or intervening elements may be present.

Figure 2:
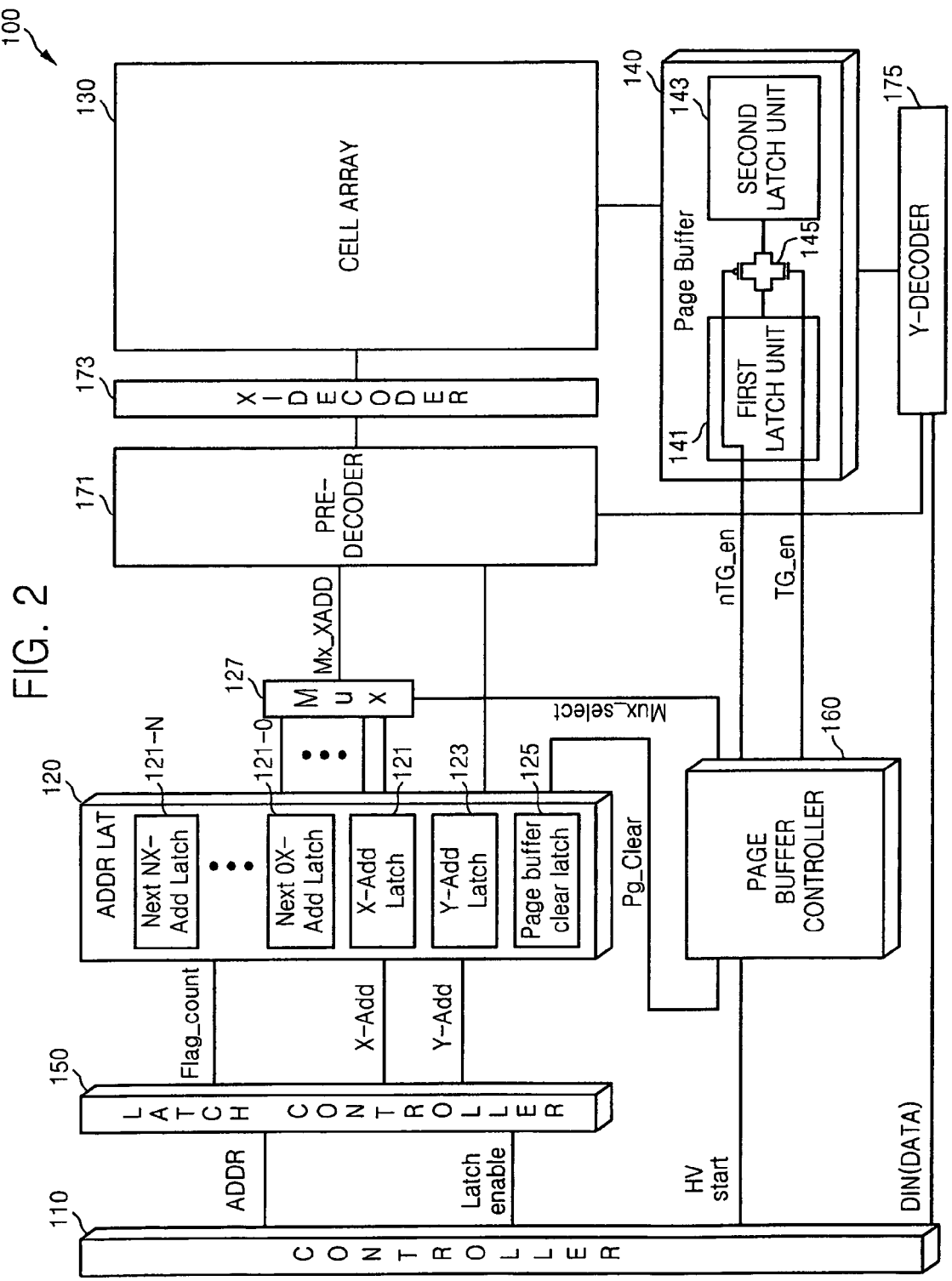
FIG. 2 is a functional block diagram of a nonvolatile semiconductor memory device according to exemplary embodiments of the present invention.

FIG. 2 is a functional block diagram of a nonvolatile semiconductor memory device 100 according to exemplary embodiments of the present invention. Referring to FIG. 2, the nonvolatile semiconductor memory device 100 includes a controller 110, an address latch unit 120, a cell array 130, and a page buffer 140. The nonvolatile semiconductor memory device 100 may further include a latch controller 150 controlling the address latch unit 120, a page buffer controller 160 controlling the page buffer 140, and/or a pre-decoder 171, an X-decoder 173 and a Y-decoder 175 which address the cell array 130. In addition, the nonvolatile semiconductor memory device 100 may further include a selector 127 which selectively outputs information stored in at least one latch included in the address latch unit 120.

The controller 110 may output a predetermined control signal for controlling at least the address latch unit 120, the cell array 130, and the page buffer 140 included in the nonvolatile semiconductor memory device 100. The controller 110 may also receive input data DATA input from an outside source and may control the page buffer 140 to write the input data DATA to the cell array 130. The controller 110 performs the above-described functions and may be implemented by one or more elements according to various exemplary embodiments.

The address latch unit 120 may temporarily store an address ADDR to address the cell array 130. The address latch unit 120 may receive the address ADDR directly from the controller 110 or via the latch controller 150. The address latch unit 120 may include a first X-address latch 121 and a Y-address latch 123 to separately store an X-address X-Add and a Y-address Y-Add which correspond to the address ADDR. In addition, the address latch unit 120 may further include one or more next X-address latches 121-0 through 121-N to store an address of a wordline next to a first wordline when the input data DATA is written over the two wordlines. The address latch unit 120 may further include a page buffer clear latch 125 which stores information for clearing a latch unit included in the page buffer 140.

The latch controller 150 may receive the address ADDR from the controller 110, divide it into the X-address X-Add and the Y-address Y-Add, and then output them to the address latch unit 120. In addition, the latch controller 150 may store and update information about a predetermined variable Flag_count indicating the number of wordlines to which the input data DATA is written in the cell array 130.

The selector 127 may selectively output information stored in the first X-address latch 121 or information stored in one of the next X-address latches 121-0 through 121-N and it may be implemented by a multiplexer (MUX). The selector 127 may receive a selection signal Mux_select from the page buffer controller 160 so as to selectively output the information stored in the first X-address latch 121 or the information stored in one of the next X-address latches 121-0 through 121-N. Alternatively, the selection signal Mux_select may be received from the controller 110.

The cell array 130 may be a group of memory cells implemented by electrically erasable programmable read-only memory (EEPROM). The nonvolatile semiconductor memory device 100 may perform a write operation and/or a read operation with respect to the cell array 130 using the page buffer 140. The cell array 130 may be EEPROM or flash EEPROM.

The pre-decoder 171 may convert an X-address output from the selector 127 and output a row selection signal for selecting a wordline corresponding to the X-address to the X-decoder 173. In addition, the pre-decoder 171 may convert a Y-address output from the Y-address latch 123 and output a column selection signal for selecting a bitline corresponding to the Y-address to the Y-decoder 175.

The X-decoder 173 may receive the row selection signal and select a wordline corresponding to the row selection signal in the cell array 130. The Y-decoder 175 may receive the column selection signal and select a bitline corresponding to the column selection signal in the cell array 130. In addition, the Y-decoder 175 may select a predetermined latch of a first latch unit 141 included in the page buffer 140 based on the column selection signal. Accordingly, the input data DATA may be stored at the latch corresponding to the column selection signal in the first latch unit 141 via the Y-decoder 175.

The page buffer 140 may include the first latch unit 141 to which the input data DATA is loaded, a second latch unit 143 which stores at least part of the input data DATA stored in the first latch unit 141, and a switch 145 which selectively transmits the input data DATA stored in the first latch unit 141 to the second latch unit 143. The first latch unit 141 stores the input data DATA at a latch corresponding to the Y-address Y-Add. The first latch unit 141 may include a number of latches corresponding to the size of the page buffer 140. For example, the number of latches may correspond to the size of data which can be loaded to the page buffer 140 at a time. The second latch unit 143 receives data to be written to one wordline in the cell array 130 among the input data DATA loaded to the first latch unit 141.

According to exemplary embodiments of the present invention, the page buffer 140 may load data and perform a write operation in byte units (e.g., in 128 byte units). For clarity of the description, it is assumed that the operations are performed in bit units. For example, when the first latch unit 141 includes eight latches and the input data DATA is 8 bits in size, all of the 8-bit input data DATA can be loaded to the first latch unit 141 in one data loading operation. When the upper 3 bits of the 8-bit input data DATA are to be written to a first wordline, the next 3 bits are to be written to a second wordline, and the next 2 bits are to be written to a third wordline, the upper 3 bits of the 8-bit input data DATA loaded to the first latch unit 141 are first transmitted to the second latch unit 143. The upper 3 bits transmitted to the second latch unit 143 may be written to a memory cell selected by the X-decoder 173 and the Y-decoder 175. After the upper 3 bits are written to the cell array 130, they are erased from the first latch unit 141 and the second latch unit 143. Next, the next 3 bits may be transmitted from the first latch unit 141 to the second latch unit 143. The next 3 bits are also erased from the first latch unit 141 and the second latch unit 143 after they are transmitted to the second latch unit 143 and written to the cell array 130. Next, the next 2 bits may be transmitted from the first latch unit 141 to the second latch unit 143. The next 2 bits are also erased from the first latch unit 141 and the second latch unit 143 after they are transmitted to the second latch unit 143 and written to the cell array 130.

The first latch unit 141 stores the input data DATA and the second latch unit 143 receives only part of the input data DATA, which will be written to the cell array 130, at one time, from the first latch unit 141. The nonvolatile semiconductor memory device 100 may include a high-voltage generation circuit (not shown) for generating a bias voltage necessary for data writing in the cell array 130 to write the data stored in the second latch unit 143 to the cell array 130. Also, it will be apparent to those skilled in the art that the nonvolatile semiconductor memory device 100 can consecutively perform an erase operation and a program operation to perform the write operation.

The switch 145 selectively transmits at least part of the input data DATA stored in the first latch unit 141 to the second latch unit 143 and may be implemented by a transmission gate.

The page buffer controller 160 may output switch control signals TG_en through nTG_en for controlling the switch 145 to the page buffer 140. As mentioned above, the page buffer controller 160 may also output the selection signal Mux_select to the selector 127. In addition, the page buffer controller 160 may receive a page buffer clear signal Pg_Clear based on information stored in the page buffer clear latch 125 and may clear latches, which correspond to the page buffer clear signal Pg_Clear in the first latch unit 141 and the second latch unit 143, in response to the page buffer clear signal Pg_Clear. To clear the latches, the page buffer controller 160 may output a predetermined latch reset signal to the page buffer 140.

Figure 3:
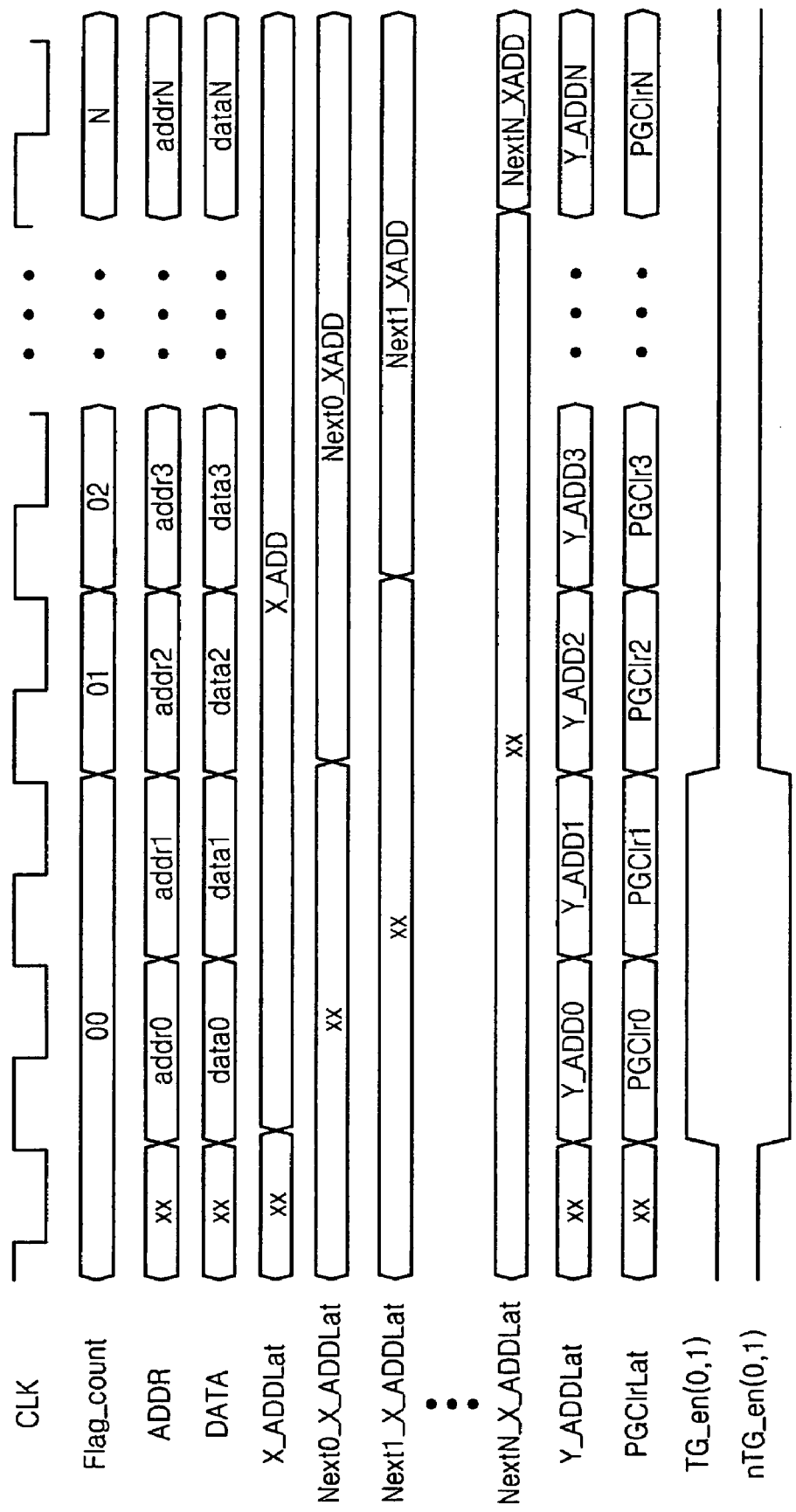
FIG. 3 is a timing chart of a nonvolatile semiconductor memory device loading data to a page buffer according to exemplary embodiments of the present invention.

FIG. 3 is a timing chart of the nonvolatile semiconductor memory device 100 loading data to the page buffer 140 according to exemplary embodiments of the present invention. Referring to FIGS. 2 and 3, the controller 110 may output the input data DATA and the address ADDR corresponding to the input data DATA to the latch controller 150 in synchronization with a clock signal CLK. The controller 110 may also output a latch enable signal to the latch controller 150 to enable the address latch unit 120. The latch controller 150 stores information about the variable Flag_count indicating the number of wordlines to which the input data DATA will be written. The variable Flag_count is set to an initial value of 0.

When first data data0 of the input data DATA and a first input address addr0 are input to the latch controller 150, the latch controller 150 divides the first input address addr0 into a first X-address X_ADD and a first Y-address Y-ADD0, which are stored in the first X-address latch (or X_ADDLat) 121 and the Y-address latch (or Y_ADDLat) 123, respectively. The first data data0 is stored in a latch corresponding to the first Y-address Y-ADD0 among the latches included in the first latch unit 141 selected by the Y-decoder 175. The first Y-address Y-ADD0 is stored in a first latch of the page buffer clear latch (or PGClrLat) 125. Since the first data data0 is data that will be first written to the cell array 130, the page buffer controller 160 outputs transmission gate enable signals TG_en(0) and nTG_en(0) to enable the first data data0 to be transmitted to the second latch unit 143.

When second data data1 of the input data DATA and a second input address addr1 are input to the latch controller 150, the latch controller 150 divides the second input address addr1 into a second X-address X_ADD and a second Y-address Y-ADD1. The second X-address X_ADD is the same as the first X-address X_ADD for the first data data0. A wordline to which the second data data1 will be written is the same as a wordline to which the first data data0 will be written, and therefore, the variable Flag_count remains at "0". Accordingly, the information stored in the first X-address latch (or X_ADDLat) 121 does not change and the second Y-address Y_ADD1 is stored in the Y-address latch (or Y_ADDLat) 123. The second data data1 is stored in a latch corresponding to the second Y-address Y-ADD1 among the latches included in the first latch unit 141 selected by the Y-decoder 175. The second Y-address Y-ADD1 is stored in a second latch of the page buffer clear latch (or PGClrLat) 125. Since the second data data1 will be written to the same wordline as the first data data1, the page buffer controller 160 outputs transmission gate enable signals TG_en(1) and nTG_en(1) to enable the second data data1 to be transmitted to the second latch unit 143. As a result, both of the first and second data data0 and data1 are stored in both of the first and second latch units 141 and 143.

When third data data2 and a third input address addr2 are input to the latch controller 150, the latch controller 150 divides the third input address addr2 into a third X-address Next0_XADD and a third Y-address Y_ADD2. The third X-address Next0_XADD is different than the X-address X_ADD for the first and second data data0 and data1. A wordline to which the third data data2 will be written is different than the wordline to which the first and second data data0 and data1 will be written, and therefore, the variable Flag_count changes into "1". Accordingly, the third X-address Next0_XADD is stored in the first next X-address latch (or Next0_X_ADDLat) 121-0 and the third Y-address Y-ADD2 is stored in the Y-address latch (or Y_ADDLat) 123. The third data data2 is stored in a latch corresponding to the third Y-address Y-ADD2 among the latches included in the first latch unit 141 selected by the Y-decoder 175. The third Y-address Y-ADD2 is stored in a third latch of the page buffer clear latch (or PGClrLat) 125. Since the third data data2 will be written to a different wordline than the first and second data data0 and data1, the third data data2 is not transmitted to the second latch unit 143. At this time, the page buffer controller 160 disables the transmission gate and the third data data2 is not transmitted to the second latch unit 143. As a result, the third data data2 is stored only in the first latch unit 141.

When the input data DATA is input up to (N+1)-th data dataN in the same manner, at least one X-address corresponding to at least one wordline to which the input data DATA will be written is stored in at least one of the next X-address latches 121-0 through 121-N. Y-addresses of the respective first through (N+1)-th data data1 through dataN of the input data DATA are stored in the page buffer clear latch (or PGClrLat) 125. The input data DATA is loaded to the first latch unit 141. In addition, data to be written to the first wordline (for example, the first data data0 and the second data data1) is loaded to the second latch unit 143.

Figure 4:
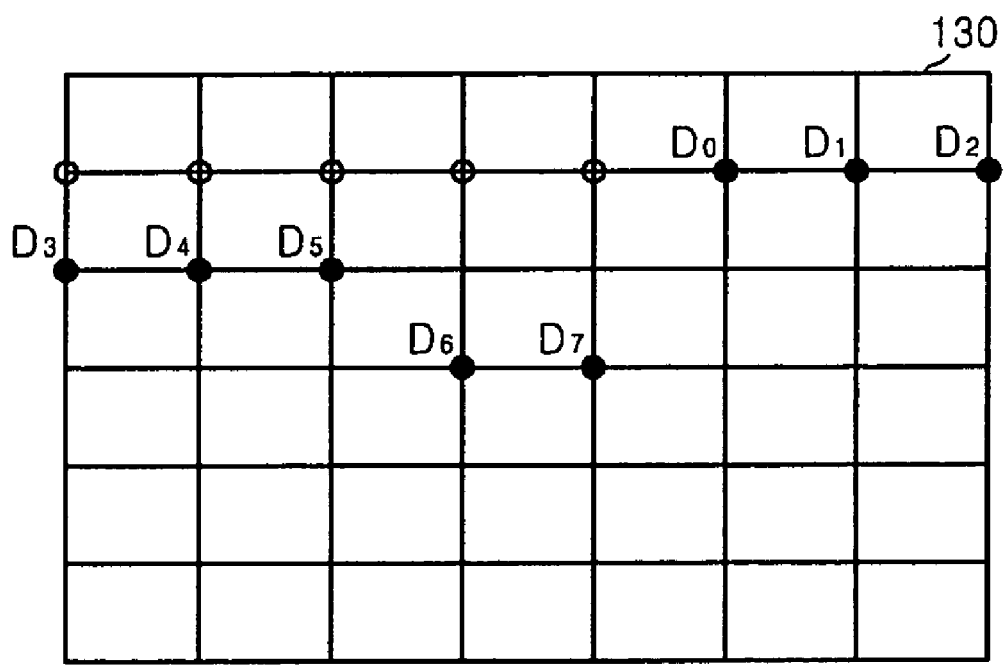
FIG. 4 illustrates data stored in the page buffer when the nonvolatile semiconductor memory device loads data to the page buffer according to exemplary embodiments of the present invention.
Figure 4:
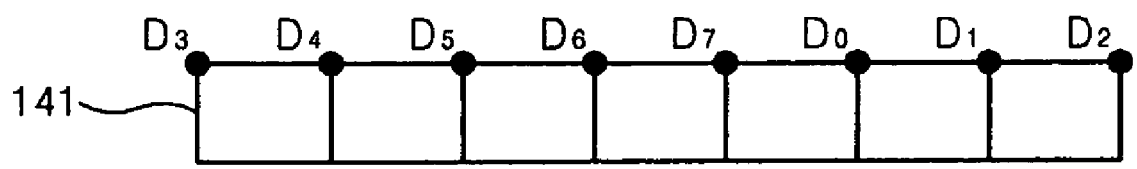
Figure 4:
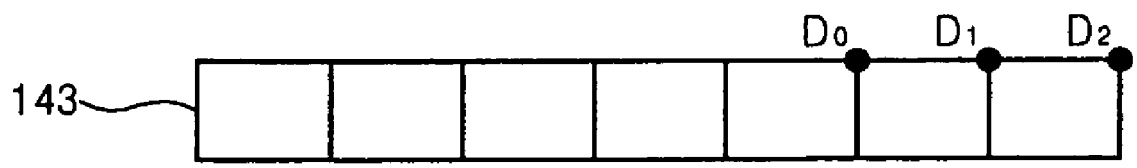

FIG. 4 illustrates data stored in the page buffer 140 when the nonvolatile semiconductor memory device 100 loads data to the page buffer 140 according to exemplary embodiments of the present invention. FIG. 4 shows a case where 8 memory cells are connected to a single wordline in the cell array 130 and the page buffer 140 is 8 bits in size.

Referring to FIG. 4, among input data D0, D1, D2, D3, D4, D5, D6, and D7, D0 through D2 are respectively written to the sixth through eighth memory cells of the first wordline. D3 through D5 are written to the first through third memory cells of the second wordline. D6 and D7 are written to the fourth and fifth memory cells of the third wordline. In this case, when the nonvolatile semiconductor memory device 100 loads the input data to the page buffer 140, all of the input data D0 through D7 are respectively loaded to latches corresponding to respective data's Y-addresses in the first latch unit 141 and only D0 through D2 to be written to the first wordline are loaded to the second latch unit 143. Then, the nonvolatile semiconductor memory device 100 can write the data D0 through D2 loaded to the second latch unit 143 based on an X-address stored in the first X-address latch 121.

Figure 5:
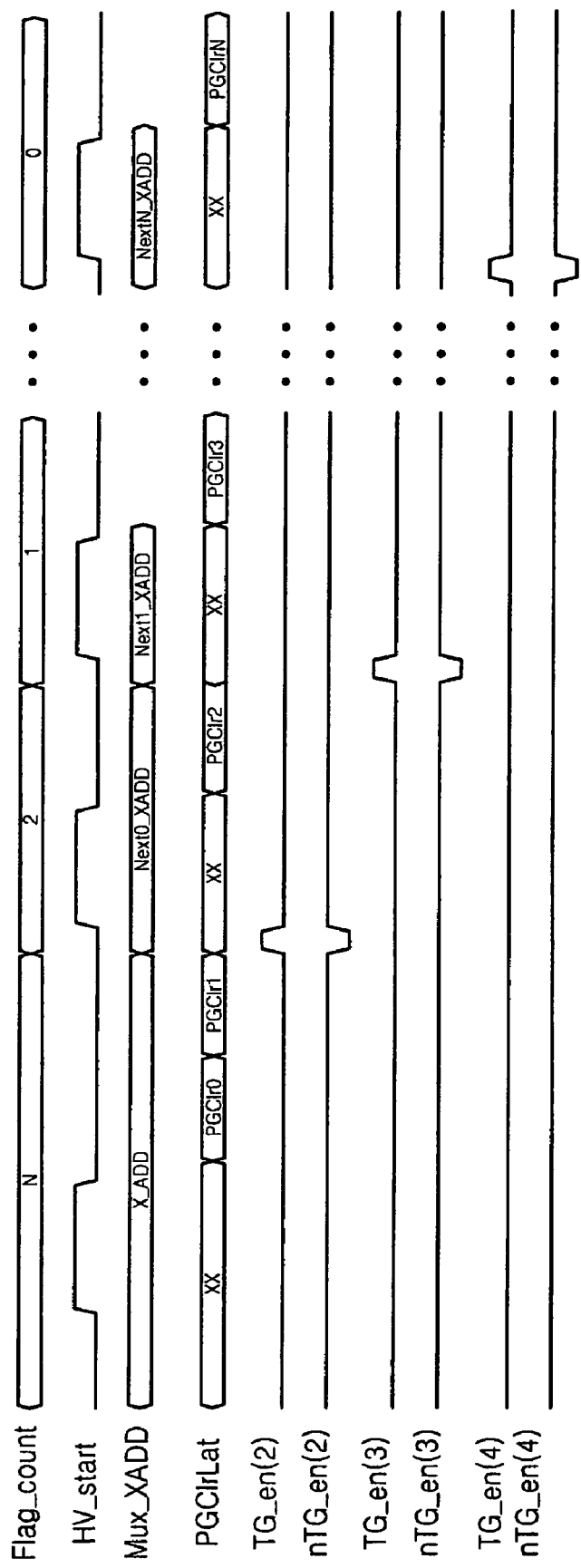
FIG. 5 is a timing chart of a write operation of a nonvolatile semiconductor memory device according to exemplary embodiments of the present invention.

FIG. 5 is a timing chart of a write operation of the nonvolatile semiconductor memory device 100 according to exemplary embodiments of the present invention. FIG. 5 shows a case where the input data DATA is written after the input data DATA is loaded to the page buffer 140 as shown in the timing chart illustrated in FIG. 3.

Referring to FIG. 5, the nonvolatile semiconductor memory device 100 performs a write operation of the first and second data data0 and data1 loaded to the second latch unit 143 of the page buffer 140 through the operation of the controller 110. The controller 110 may output a high-voltage generation signal HV_start to the high-voltage generation circuit (not shown). The high-voltage generation signal HV_start may be transmitted to the high-voltage generation circuit via the page buffer controller 160, as illustrated in FIG. 2. The page buffer controller 160 may output the selection signal Mux_select to the selector 127 and the X-address X_ADD stored in the first X-address latch 121 is selectively output to the pre-decoder 171. An address Mux_XADD output by the selector 127 to the pre-decoder 171 is the X-address X_ADD. Then, the X-decoder 174 can select a wordline corresponding to the X-address X_ADD. Then, the first and second data data0 and data1 stored in the second latch unit 143 are written to memory cells which respectively correspond to positions of the first and second data data0 and data1 in the second latch unit 143 on the selected wordline. Thereafter, the page buffer controller 160 may erase the first and second data data0 and data1 from the first and second latch units 141 and 143 based on information PGClr0 and PGClr1 stored in the page buffer clear latch 125, for example, Y-addresses Y_ADD0 and Y_ADD1 of the first and second data data0 and data1. Then, the value of the variable Flag_count is reduced by 1.

Next, the nonvolatile semiconductor memory device 100 transmits the data to be written to the second wordline from the first latch unit 141 to the second latch unit 143. For the transmission, the page buffer controller 160 may output a transmission gate enable signal TG_en(2) for a latch storing the data corresponding to the second wordline to the transmission gate, for example, the switch 145. In addition, the page buffer controller 160 may output the selection signal Mux_select and the information Next0_XADD stored in the first next X-address latch 121-0 can be output to the pre-decoder 171 via the transmission gate, for example, the switch 145. Then, the data corresponding to the second wordline is stored in the second latch unit 143 and the stored data can be written to the cell array 130. Thereafter, the data can be erased from the first and second latch units 141 and 143 based on information PGClr2 stored in the page buffer clear latch 125. The nonvolatile semiconductor memory device 100 performs these operations until the variable Flag_count becomes 0 and all of the input data DATA loaded to the first latch unit 141 can be written to the cell array 130. As described above, the writing operation can be performed by consecutively perform an erase operation and a program operation.

Figure 6:
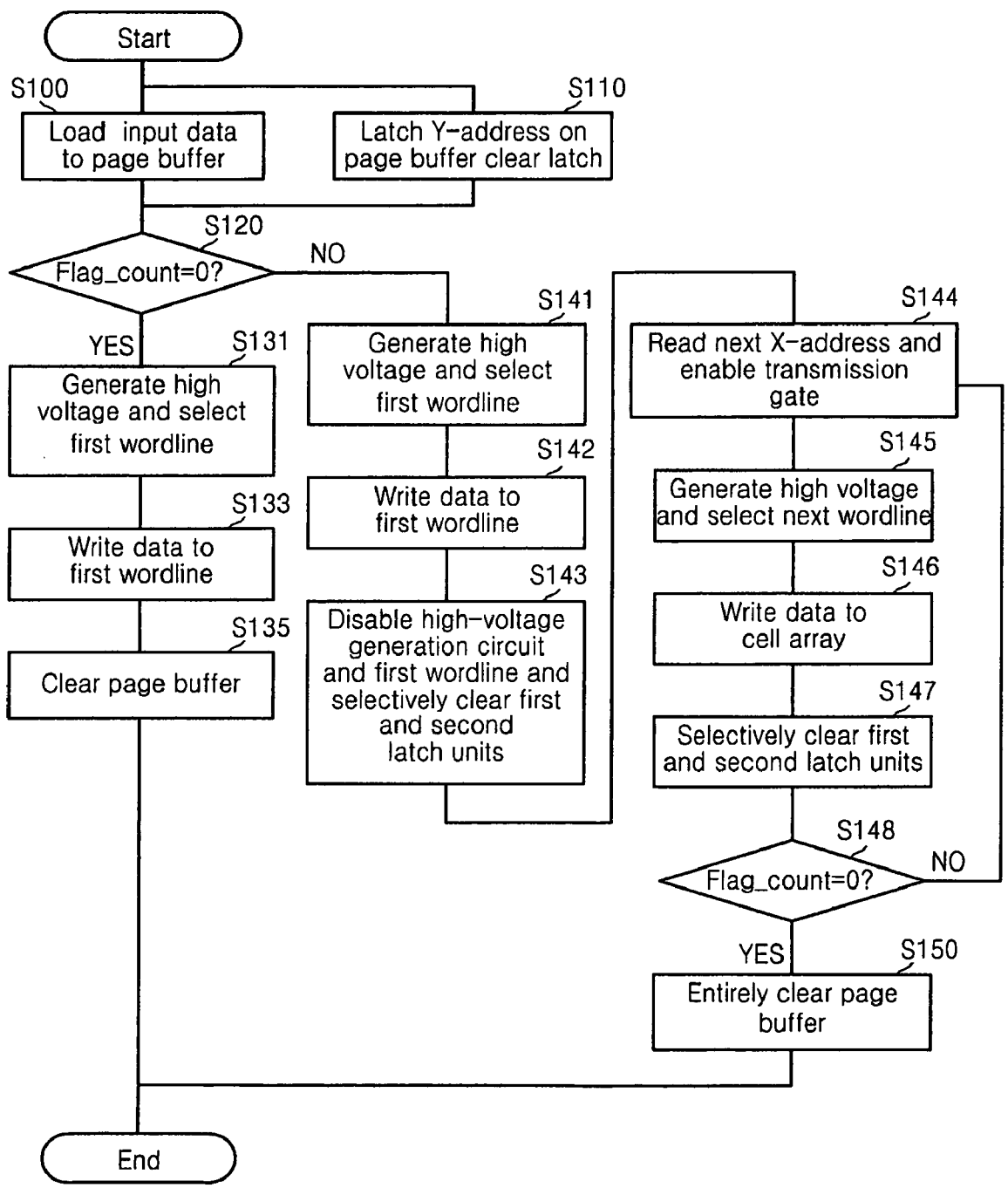
FIG. 6 is a flowchart for explaining a data flow in a nonvolatile semiconductor memory device according to exemplary embodiments of the present invention.

FIG. 6 is a flowchart illustrating a data flow in the nonvolatile semiconductor memory device 100 according to exemplary embodiments of the present invention. Referring to FIGS. 2 and 6, the nonvolatile semiconductor memory device 100 sequentially loads input data to the page buffer in operation S100. While loading the input data to the page buffer 140, the nonvolatile semiconductor memory device 100 latches Y-addresses of the input data on the page buffer clear latch 125 in operation S110 and data can be cleared from the page buffer 140 after being written to the cell array 130. When the data loading is completed, all of the input data is loaded to the first latch unit 141 in the page buffer 140 and among the input data, data corresponding to a first wordline is loaded to the second latch unit 143 in the page buffer 140.

When it is determined that the variable Flag_count indicating the number of wordlines to which the input data will be written is "0" in operation S120 (Yes, S120), all of the input data will be written to a single wordline, and therefore, all of the data loaded to the first latch unit 141 is also loaded to the second latch unit 143. In operation S131, the controller 110 controls the high-voltage generation circuit (not shown) to generate a high voltage necessary for a write operation and the X-decoder 173 can select the first wordline. Then, the nonvolatile semiconductor memory device 100 writes the data loaded to the second latch unit 143 to the selected wordline in the cell array 130 in operation S133 and finishes the write operation of the input data by clearing the page buffer 140 in operation S135.

When the variable Flag_count is not "0" (No, S120), the input data is written over at least two wordlines, and therefore, only data corresponding to the first wordline is loaded to the second latch unit 143. In operation S141, the controller 110 controls the high-voltage generation circuit to generate a high voltage necessary for a write operation and the X-decoder 173 can select the first wordline. Then, the nonvolatile semiconductor memory device 100 writes the data loaded to the second latch unit 143 to the selected wordline in the cell array 130 in operation S142. Thereafter, in operation S143, the nonvolatile semiconductor memory device 100 disables the high-voltage generation circuit and the selected wordline and clears latches corresponding to the data written to the cell array 130 in the first and second latch units 141 and 143. In operation S144, an X-address corresponding to a second wordline is read from a latch storing the X-address corresponding to the second wordline among the next X-address latches 121-0 through 121-N. The transmission gate, for example, the switch 145, is enabled and data corresponding to the second wordline is transmitted from the first latch unit 141 to the second latch unit 143. In operation S145, the nonvolatile semiconductor memory device 100 generates the high voltage necessary for the write operation through the high-voltage generation circuit and the X-decoder 173 selects the second wordline. In operation S146, the nonvolatile semiconductor memory device 100 writes the data loaded to the second latch unit 143 to the second wordline in the cell array 130. In operation S147, the nonvolatile semiconductor memory device 100 clears latches corresponding to the data written to the second wordline in the first and second latch units 141 and 143. When it is determined that the variable Flag_count is "0" (Yes, S148), that is, when it is determined that all of the input data is written to the cell array 130 in operation S148, the page buffer 140 is entirely cleared in operation S150 and the writing operation ends. When the variable Flag_count is not "0" in operation S148 (No, S148), the write operation goes back to operation S144 in which a next X-address is read and the following operations are repeated.

As described above, exemplary embodiments of the present invention provide that a user does not need to set a start address in a cell array when data is written using a page buffer.

While exemplary embodiments of the present invention have been particularly shown and described, it will be understood by those of ordinary skill in the art that various changes in form and details may be made therein without departing from the spirit and scope of the present invention.

What is claimed is:

1. A nonvolatile semiconductor memory device comprising:

a cell array;

a controller configured to receive input data from an outside source;

an address latch unit configured to store a Y-address of the input data and at least two X-addresses respectively corresponding to at least two wordlines based on an address of the input data output from the controller;

a latch controller controlling the address latch unit to store a first X-address corresponding to a first wordline in an X-address latch and to store at least one next X-address corresponding to a wordline next to the first wordline in at least one next X-address latch when it is determined based on the address of the input data output from the controller that the input data is written to the next wordline; and a page buffer configured to receive the input data from the controller and temporarily store the input data, wherein the controller operates to write the data stored in the page buffer over the at least two wordlines in the cell array based on the at least two X-addresses and the Y-address.

2. The nonvolatile semiconductor memory device of claim 1, wherein the page buffer comprises:
- a first latch unit configured to store data up to a size of the page buffer;
- a second latch unit configured to store at least part of the data stored in the first latch unit; and
- a switch configured to selectively transmit at least part of the data stored in the first latch unit to the second latch unit, and
- wherein the controller operates to write data stored in the second latch unit to the cell array.

3. The nonvolatile semiconductor memory device of claim 2, further comprising a page buffer controller configured to control the switch.

4. The nonvolatile semiconductor memory device of claim 3, wherein the address latch unit further comprises;
- a page buffer clear latch configured to erase data written to the cell array from the first latch unit and the second latch unit, and
- wherein the page buffer controller receives information stored in the page buffer clear latch and operates to clear the first latch unit and the second latch unit of data corresponding to the received information.

5. The nonvolatile semiconductor memory device of claim 1, further comprising a selector configured to selectively output an X-address stored in the X-address latch or the at least one next X-address latch, wherein the controller operates to select at least one cell in the cell array based on the X-address output from the selector and the Y-address output from the Y-address latch.

6. The nonvolatile semiconductor memory device of claim 1, wherein the cell array is flash memory or electrically erasable and programmable read only memory (EEPROM).

7. The nonvolatile semiconductor memory device of claim 1, further comprising:
- an X-decoder for receiving a row selection signal and selecting a wordline corresponding a the row selection signal of the cell array; and
- a Y-decoder for receiving a column selection signal and selecting a bitline corresponding to a column selection signal of the cell array.

8. The nonvolatile semiconductor memory device of claim 7, further comprising a pre-decoder for converting the Y-address output from the address latch and outputting a column selection signal for selecting a bitline corresponding to the Y-address to the Y-decoder.

9. A nonvolatile semiconductor memory device comprising:
- a cell array;
- a controller configured to receive data input from an outside source;
- an address latch unit configured to store an address of the data output from the controller; and
- a page buffer comprising:
  - a first latch unit configured to store data up to a size of the page buffer;
  - a second latch unit configured to store at least part of the data stored in the first latch unit; and
  - a switch configured to selectively transmit at least part of the data stored in the first latch unit to the second latch unit, and
- wherein the controller operates to write data stored in one of the at least two latch units to the cell array and controls the switch to transmit at least part of the data stored in the first latch unit to the second latch unit and operates to write the at least part of the data in the second latch unit to the cell array.

10. The nonvolatile semiconductor memory device of claim 9, wherein the address latch unit comprises:
- an X-address latch configured to store a first X-address corresponding to a first wordline to which the input data is written in the cell array;
- at least one next X-address latch configured to store a next X-address corresponding to a wordline next to the first wordline when the input data is written to the next wordline; and
- a Y-address latch configured to store the Y-address of the input data.

11. The nonvolatile semiconductor memory device of claim 10, further comprising, a latch controller controlling the address latch unit to store the next X-address in the at least one next X-address latch when it is determined based on the address of the input data output from the controller that the input data is written to the next wordline.

12. A writing method of a nonvolatile semiconductor memory device, comprising:
- loading input data to a first latch unit and loading data corresponding to a first wordline of the input data to a second latch unit;
- writing the data loaded to the second latch unit to a cell array;
- transmitting, among the input data loaded to the first latch unit, data corresponding to a second wordline to the second latch unit; and
- writing the data corresponding to the second wordline in the second latch unit to the cell array,
- wherein the loading of the input data to the first latch unit and the data corresponding to the first wordline among the input data to the second latch unit comprises:
  - detecting an address corresponding to the second word line based on an address of the input data;
  - when the address corresponding to the second wordline is detected, storing the address corresponding to the second wordline in at least one next X-address latch; and
  - transmitting the input data from the first latch unit to the second latch unit until the address corresponding to the second wordline is detected.

13. The writing method of claim 12, further comprising clearing the first latch unit and the second latch unit of the data corresponding to the first wordline before the transmitting, among the input data loaded to the first latch unit, the data corresponding to the second wordline to the second latch unit.

14. The writing method of claim 13, wherein the writing of the data corresponding to the second wordline in the second latch unit to the cell array comprises writing the data to the cell array based on the address, which corresponds to the second wordline and is stored in the at least one next X-address latch.

15. The writing method of claim 12, wherein a high-voltage bias voltage is generated for writing data to the cell array.

16. The writing method of claim 12, wherein the write method includes the consecutive performance of an erase operation and a program operation.

* * * * *